United States Patent [19]
Ferro

[11] Patent Number: 5,381,596
[45] Date of Patent: Jan. 17, 1995

[54] APPARATUS AND METHOD OF MANUFACTURING A 3-DIMENSIONAL WAVEGUIDE

[75] Inventor: John F. Ferro, Hyattsville, Md.
[73] Assignee: E-Systems, Inc., Dallas, Tex.
[21] Appl. No.: 21,041
[22] Filed: Feb. 23, 1993
[51] Int. Cl.⁶ .......................................... H01P 11/00
[52] U.S. Cl. ........................................ 29/600; 29/825; 156/901; 156/902
[58] Field of Search ................ 29/600, 825; 156/901, 156/902

[56] References Cited

U.S. PATENT DOCUMENTS

| | | |
|---|---|---|
| 3,157,847 | 11/1964 | Williams . |
| 3,597,710 | 8/1971 | Levy . |
| 4,575,700 | 3/1986 | Dalman ........................ 29/600 X |
| 4,647,882 | 3/1987 | Landis . |
| 4,654,611 | 3/1987 | Wong et al. . |
| 4,787,271 | 11/1988 | Higgins, Jr. .................... 29/600 X |
| 4,797,995 | 1/1989 | Chang ............................. 29/825 |

FOREIGN PATENT DOCUMENTS

| | | |
|---|---|---|
| 60-62202 | 4/1985 | Japan .................................. 29/600 |
| 762373 | 11/1956 | United Kingdom ................. 29/600 |
| 2217114 | 10/1989 | United Kingdom . |
| 1424081 | 9/1988 | U.S.S.R. ............................. 29/600 |

Primary Examiner—Carl J. Arbes
Attorney, Agent, or Firm—Rogers & Killeen

[57] ABSTRACT

A waveguide able to operate at frequencies above 20 GHz is embedded in a printed wiring board. The waveguide is formed by evacuating a waveguide path through one or more dielectric layers of the board and joining the layers. After the layers are joined, the waveguide cavity is electroless copper plated by providing an electroless plating solution in the cavity. Thereafter, the cavity walls are electroplated to form seamless electrically conductive walls for the waveguide. A dielectric may also be provided in the cavity if desired. Electronic components may be formed in the waveguide by evacuating one or more layers of a printed wiring board in a similar manner, interconnected to the waveguide. In one embodiment, the components may convert the frequency of the signal carried in the waveguide so that higher frequency signals are processed within the RFI EMI protection of the layers of the wiring board.

12 Claims, 2 Drawing Sheets

APPARATUS AND METHOD OF MANUFACTURING A 3-DIMENSIONAL WAVEGUIDE

BACKGROUND OF THE INVENTION

The present invention relates to three-dimensional waveguide structures, and more particularly to waveguides embedded in printed wiring boards that are able to operate at frequencies above 20 Ghz and to a method of manufacture thereof.

Devices for guiding the movement of electromagnetic waves are known as waveguides. Waveguides are generally enclosed spaces, which may be defined by encompassing walls formed of a material having a dielectric constant difference from that of the spaces. The cross-sectional dimensions of the waveguides depend on the frequency of the waves being guided and the desired transmission mode. Waveguides with improper dimensions may distort the signal passing therethrough. Where the frequency of the waves is very high, for example, above 20 Ghz, the cross-sectional dimensions of the waveguide must be very small, on the order of millimeters in size and may preclude the use of normal manufacturing methods.

Waveguides may be included in multi-layer printed wiring boards. As illustrated in FIG. 1, a multi-layered printed wiring board 10 may consist of plural dielectric layers 12, each sandwiched between two electrically conductive layers 14. Each of the electrically conductive layers 14 contains part of the circuit for the printed wiring board 10. In its most common use, electrical circuit paths are etched or formed onto the upper and/or lower surfaces of the board and electrical components are attached to the paths and interconnected thereby. Depending upon the type of board the intermediate conductive layers 14 may not be present. Propagation of electrical signals from one conductive layer 14 to another is often made by vias (not shown) which pierce through all or a portion of the board 10. A typical printed wiring board 10 for microwave and higher frequency signals may have three or four dielectric layers 12 and have a total thickness of 1 to 2 millimeters.

While various methods are known for making small waveguide cavities in printed wiring boards, none are known to provide cavity walls of the smoothness required to avoid the introduction of distorted or spurious signals. For example, it is known to build the waveguide cavity walls by layering successive depositions of conductive strips within the various dielectric layers. See, U.S. Pat. No. 4,647,882 to Landis. It is also known to form the waveguide cavity in a substrate material and to electroplate the walls of the cavity before the layers of substrate are placed together. See, for example, U.S. Pat. No. 3,157,847 to Williams. As is apparent, these processes may introduce non-uniformities into the wall of the waveguide cavity if each of the steps is not precisely carried out and the various layers are not stacked precisely upon each other. As such precision may substantially increase the cost of manufacturing such wave guides, it is desirable to develop a method of manufacturing a waveguide capable of operating at frequencies above 20 Ghz in which the manufacturing method does not require the precision of the prior art and does not produce the non-uniformities in the walls of the waveguide cavity.

A difficulty that often is presented when dealing with high frequency signals is the tendency of such signals to generate RFI/EMI (Radio Frequency Interference/Electromagnetic Interference) into nearby electrical components and signal paths and to be adversely affected by RFI/EMI from other sources. To prevent or reduce the RFI/EMI effect, it is known to construct special metal shields around electronic components and to attempt to segregate portions of circuits dealing with higher frequency signal from those portions of the circuit dealing with lower frequency signals. The former adds costs, uses valuables board space and may tend to overheat enclosed components; the latter is not always possible for all circuit designs and usually complicates the layout of the circuit on the wiring board.

Accordingly, it is an object of the present invention to provide a novel waveguide and method of manufacture thereof that obviates the problems of the prior art.

It is a further object of the present invention to provide a novel method of embedding a waveguide cavity and active and passive signal processing components in a printed wiring board.

It is still a further object of the present invention to provide a novel method of making a waveguide inside a printed wiring board in which the walls of the waveguide cavity are plated with an electrically conductive material after the layers of the printed wiring board have been joined together.

It is yet a further object of the present invention to provide a novel printed wiring board having a waveguide therein that has substantially seamless electroplated walls.

It is another object of the present invention to provide a novel method of isolating higher frequency signals from portions of an electrical circuit operating at a lower frequency.

It is yet another object of the present invention is to provide a novel printed wiring board having a waveguide cavity connected to frequency conversion components in the same dielectric layer as the waveguide.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 1:
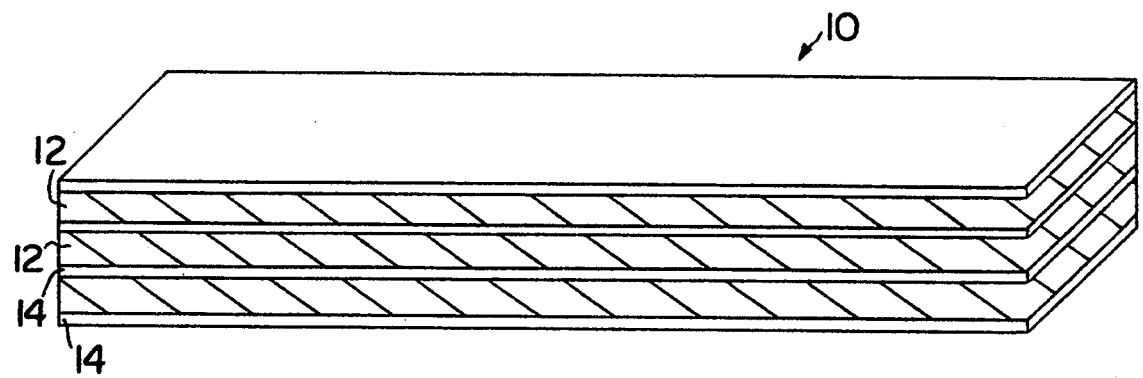
FIG. 1 is a pictorial representation of a multi-layer printed wiring board of the prior art.
Figure 2:
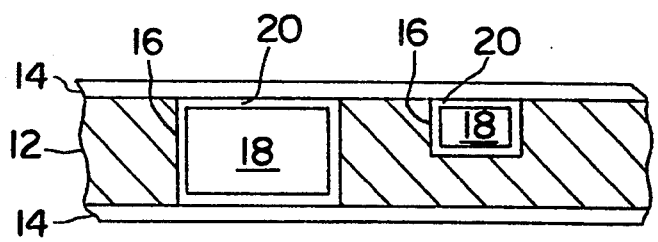
FIG. 2 is a partial vertical cross-section of a printed wiring board illustrating the waveguide cavity of the present invention.

With reference now to FIG. 2, the present invention will find application in printed wiring boards having dielectric Layers 12 sandwiched between electrically conductive layers 14. A cavity 16 for the waveguide 18 may be evacuated from the dielectric layer 12. The cavity 16 may take any desired path through the dielectric layer 12 to transport electromagnetic waves therethrough. In contrast of the prior art, after the layers of dielectric material 12 and layers of electrically conductive material 14 have been placed together, the walls of the cavity 16 are electroless copper plated by inserting an electroless copper plating solution into the cavity 16. The inserting may be done by injection, immersion, or any conventional method for introducing a solution into a cavity. Thereafter, the electroless-plated cavity walls may be electroplated with an electrically conductive material to form walls 20 that are uniformly smooth. If appropriate, the plated waveguide cavity 16 may be filled with a dielectric material. The dielectric material may have a dielectric constant different from that of free space so that size of the waveguide cavity may be reduced from that without this type of dielectric material. The dielectric material may be added in liquid form after the cavity is plated and before it is closed.

As illustrated in FIG. 2, the cavity 16 may extend completely through the dielectric layer 12 or partially therethrough depending on the size of the waveguide cavity and the thickness of the dielectric layer 12. In a preferred embodiment, the waveguide has a rectangular cross-section so that the waveguide will operate in the $TE_{10}$ transmission mode, with other shapes being known by those skilled in the art depending on the desired transmission mode.

Also in a preferred embodiment, the cavity is located at an upper or lower surface of the dielectric layer 12. In this location, the cavity may be readily evacuated and the cavity is protected from RFI EMI by the adjacent conductive layer(s) 14, which may also serve as ground plane(s) for the waveguide. The cavity 18 could also be formed, in part, by boring into the dielectric layer and by any conventional method for forming an accessible cavity within a dielectric layer.

While the dielectric layer 12 and the conductive layer 14 have been illustrated as being flat, and most printed wiring boards presently are, the present invention is not limited to flat layers and may be carried out in layers having arcuate, bent or disjointed forms.

Further, while the preferred embodiment utilizes an electroless copper plating followed by an electroplating; other processes and materials can be used to provide some degree of smoothness to the interior of the waveguide and to provide a wall surface within which the signals are conducted.

In the electroplating step, the entire printed wiring board, or the dielectric layers that have been assembled, may be the cathode and sacrificial metal the anode so that the waveguide cavity and the surfaces of the board are electroplated. The electroplating can thereby be used to add electrically conductive layers 14 to the board. The electroplated board surfaces may be trimmed as appropriate to provide wiring and circuitry for the board.

Figure 3:
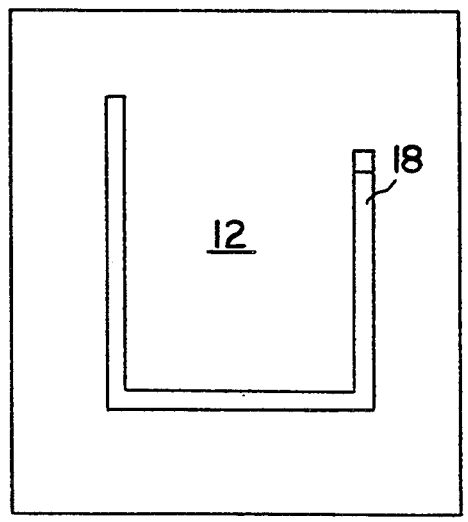
FIG. 3 is an overhead plan view of a dielectric layer illustrating a waveguide of the present invention extending laterally across the layer.
Figure 4:
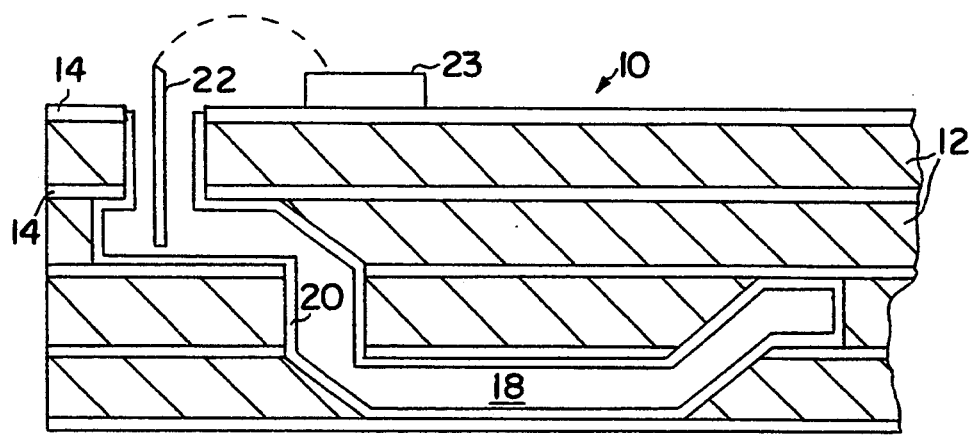
FIG. 4 is a partial vertical cross-section of a printed wiring board illustrating a waveguide of the present invention extending vertically through several dielectric and conductive layers.

With reference now to FIGS. 3 and 4, the path of the waveguide cavities may extend through and/or across one or more of the dielectric layers 12 and conductive layers 14. A connective cable 22 may be provided to connect the waveguide to appropriate circuitry 23 to introduce a signal thereto or extract it therefrom. In the event the waveguide cavity 16 does not extend to a surface of the printed wiring board when the board is completely assembled so that the electroless plating and electroplating may be accomplished, the board may be assembled several layers at a time so as to allow access to the cavity 16 for the electroless plating and the electroplating steps.

Figure 5:
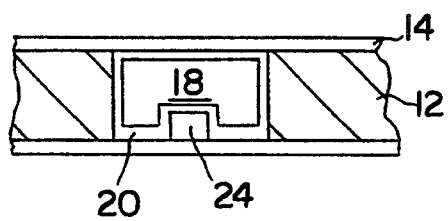
FIG. 5 is a partial vertical cross-section of a printed wiring board illustrating a further embodiment of the present invention with a ridge therein.

As illustrated in FIG. 5, a ridge 24 may extend all or part of the way through the waveguide 18. The ridge will extend the useable frequency range of the waveguide if needed in the circuit of which the waveguide is a part. The ridge 24 may be provided when the cavity 16 is formed or may be added later. The cable 22 may be attached to or placed near the ridge 24 to communicate the signal thereto or therefrom.

In a further embodiment of the present invention, the waveguide cavity may include cavities formed in the dielectric material that serve as components of the circuit of the printed wiring board. For example, components such as power dividers, filters, reflection amplifiers, phase shifters, and circulators can be made by evacuating portions of the dielectric in appropriate shapes and, where necessary, embedding further components such as diodes therein. For example, with reference to FIG. 6, a reflection amplifier may be formed by evacuating a circular area 26 and providing a diode 28 in a notched portion thereof. The signal carrying the input frequency that is to be converted may enter the waveguide cavity 18 at branch 30 and a local oscillator frequency may enter at branch 32. A low pass filter 34 may be placed in the cavity as necessary, with the down converted frequency being carried at portion 36 of the waveguide.

Figure 6:
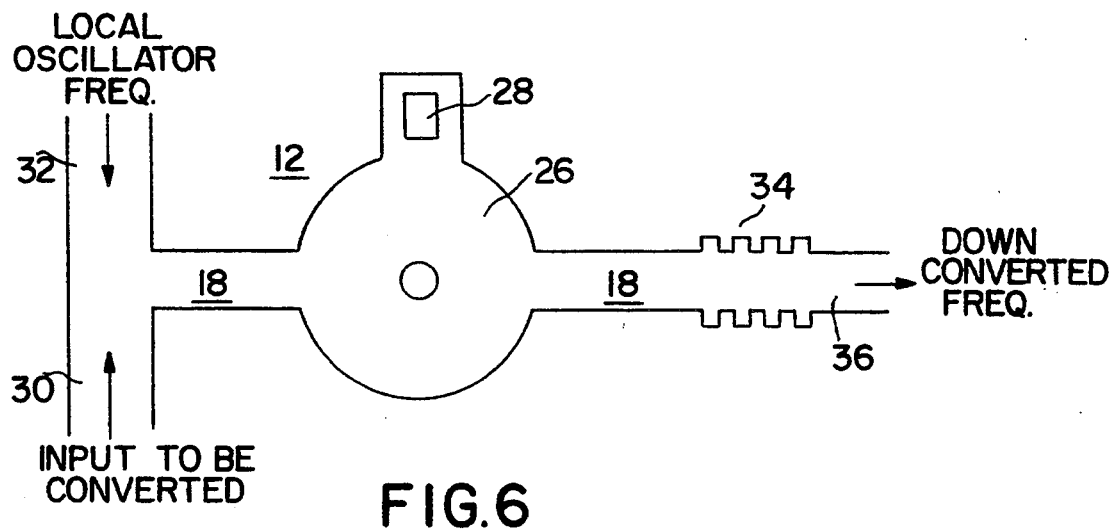
FIG. 6 is an overhead plan view of a portion of a dielectric layer of the present invention illustrating an electronic component cavity.

Because of the ability to form electronic components from the shape of the waveguide cavity, the waveguide may be used for more than merely carrying a signal from one location to another but may also be used to provide entire circuits and/or sub-circuits. In such circuits, the waveguide includes both signal carrying elements which interconnect signal modifying elements (dividers, filters, shifters, etc., etc.) to provide an entire circuit or portion thereof. Using this capability, for example, may have particular use in a high frequency receiver. In such a receiver, a high frequency signal received from an antenna may be provided directly to a waveguide of the present invention embedded within a printed wiring board. Circuit elements interconnected with and formed similarly to the waveguide cavity (for example, as illustrated in FIG. 6) may be used to down convert the high frequency signal to an intermediate frequency signal or to a baseband signal. The intermediate signal or baseband signal may be passed to a further electronic circuit which is constructed in a conventional fashion on one or both of the exterior surface of the board or to a circuit on another layer. By immediately "burying" the high frequency signal within the shielded interior of the board, the relatively lower frequency circuits on the surface of the board are protected from the RFI/EMI of the high frequency components, and vice versa. Thus, additional and costly shielding of the surface of the board may be avoided and additional board area is available for other circuits.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal thereof.

What is claimed is:

1. A method of making a waveguide inside a printed wiring board that has plural dielectric layers, each of the dielectric layers having an electrically conductive layer on a first surface thereof forming a portion of a circuit for the printed wiring board, the method comprising the steps of:
   a. identifying a path for a waveguide cavity on a second surface of selected ones of the plural dielectric layers;
   b. evacuating the waveguide cavity along the identified path;
   c. joining said plural dielectric layers so that the evacuated waveguide cavity is covered on at least one side by an electrically conductive layer from an adjoining one of the dielectric layers;
   d. injecting an electroless copper plating solution into the covered waveguide cavity so that the interior of the cavity is electroless copper plated;
   e. electroplating over the electroless copper plating to form electrically conductive walls for the waveguide cavity; and
   f. connecting the waveguide to the circuit for the printed wiring board.

2. The method of claim 1 further comprising the step of filling the electroplated waveguide cavity with a dielectric material.

3. The method of claim 2 wherein the dielectric material is in a liquid state when the waveguide cavity is being filled.

4. The method of claim 1 wherein said evacuated waveguide cavity extends through one of said plural dielectric layers so that two opposing walls of the evacuated waveguide cavity therein are each covered by one said electrically conductive layer when said plural dielectric layers are joined.

5. The method of claim 1 wherein the plated waveguide cavity has a rectangular cross section so that the waveguide is capable of carrying signals above 20 Ghz while operating in the $TE_{10}$ mode.

6. The method of claim 1 wherein the cavity is electroplated by submerging the joined layers into an electroplating bath so that the exposed surfaces of the joined layers are also electroplated.

7. The method of claim 1 further comprising the steps of providing frequency converting components connected to said waveguide in an interior one of said plural dielectric layers and providing circuitry on an exposed surface of the printed wiring board connected to said frequency converting components so that said circuitry can process a signal at a frequency different than the frequency carrying the signal in the waveguide.

8. The method of claim 7 wherein said frequency converting components are provided by evacuating a portion of said interior one of the dielectric layers when said waveguide cavity is being evacuated.

9. A method of embedding a waveguide cavity and signal processing components in a laminate having plural dielectric layers comprising the steps of:
   a. evacuating channels for the waveguide cavity and the signal processing components in a surface of selected ones of the dielectric layers;
   b. joining the dielectric layers to form the laminate having a waveguide cavity and signal processing components therein formed by the evacuated channels, the interiors of the evacuated channels being accessible from the exterior of the laminate;
   c. injecting an electroless plating solution into the waveguide cavity and the signal processing components to apply an electroless plating to the interior thereof; and
   d. submerging the laminate in an electroplating solution to apply an electrically conductive layer to the electroless plated interiors and to exposed surfaces of the laminate.

10. The method of claim 9 wherein said signal processing components comprise frequency converting components connected to said waveguide cavity and wherein signal processing circuitry is provided on an exposed surface of the laminate connected to said frequency converting components so that said circuitry can process a signal at a frequency different than the frequency carrying the signal in the waveguide.

11. A method of constructing a waveguide in a circuit board having plural layer of dielectric material comprising the steps of:
   (a) providing plural layers of dielectric material;
   (b) evacuating a channel within one or more of the layers;
   (c) joining at least some of the dielectric layers to form a laminate having a waveguide cavity formed by the evacuated channel, the interior of the evacuated channel being accessible from the exterior of the laminate; and
   (d) applying a conductive coating to the interior of the channel.

12. The method of claim 15, further comprising the step of:
   (e) substantially filling the channel with a material having a dielectric constant different from that of free space.

* * * * *